(12) United States Patent
Bhatia

(10) Patent No.: US 6,209,626 B1
(45) Date of Patent: Apr. 3, 2001

(54) HEAT PIPE WITH PUMPING CAPABILITIES AND USE THEREOF IN COOLING A DEVICE

(75) Inventor: Rakesh Bhatia, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/228,817

(22) Filed: Jan. 11, 1999

(51) Int. Cl.[7] .................................................. F28D 15/00
(52) U.S. Cl. ................. 165/104.25; 165/104.26; 165/104.34; 361/700; 361/687; 174/15.2
(58) Field of Search .................. 165/104.26, 104.33, 165/104.31, 104.34, 104.25; 361/687; 174/15.2

(56) References Cited

U.S. PATENT DOCUMENTS

| | | | | |
|---|---|---|---|---|
| 3,605,878 | * | 9/1971 | Coleman | 165/104.26 |
| 4,067,237 | * | 1/1978 | Arcella | 165/104.26 |
| 4,094,357 | * | 6/1978 | Sigroi | 165/104.26 |
| 4,336,837 | * | 6/1982 | Koenig | 165/104.26 |
| 4,352,392 | * | 10/1982 | Eastman | 165/104.26 |
| 4,441,548 | * | 4/1984 | Franklin et al. | 165/104.26 |
| 4,463,798 | * | 8/1984 | Pogson et al. | 165/104.26 |
| 4,583,582 | * | 4/1986 | Grossman | 165/104.26 |
| 4,664,177 | * | 5/1987 | Edelstein | 165/104.26 |
| 4,921,041 | * | 5/1990 | Akachi | 165/104.26 |
| 4,930,996 | * | 6/1990 | Jensen et al. | 417/373 |
| 5,107,920 | * | 4/1992 | Scotti et al. | 165/109.1 |
| 5,345,998 | * | 9/1994 | Itoh | 165/86 |
| 5,725,049 | * | 3/1998 | Swanson et al. | 165/104.26 |
| 5,757,615 | * | 5/1998 | Donahoe et al. | 361/687 |
| 5,781,409 | * | 7/1998 | Mecredy, III | 361/687 |
| 5,841,244 | * | 11/1998 | Hamilton et al. | 165/104.26 |

* cited by examiner

Primary Examiner—Ira S. Lazarus
Assistant Examiner—Terrell McKinnon
(74) Attorney, Agent, or Firm—Jeffrey S. Draeger

(57) ABSTRACT

A heat pipe with pumping capabilities and use thereof in cooling a device. One embodiment of the heat pipe has an internal pumping mechanism that provides an enhanced capillary flow within a chamber of the heat pipe.

20 Claims, 6 Drawing Sheets

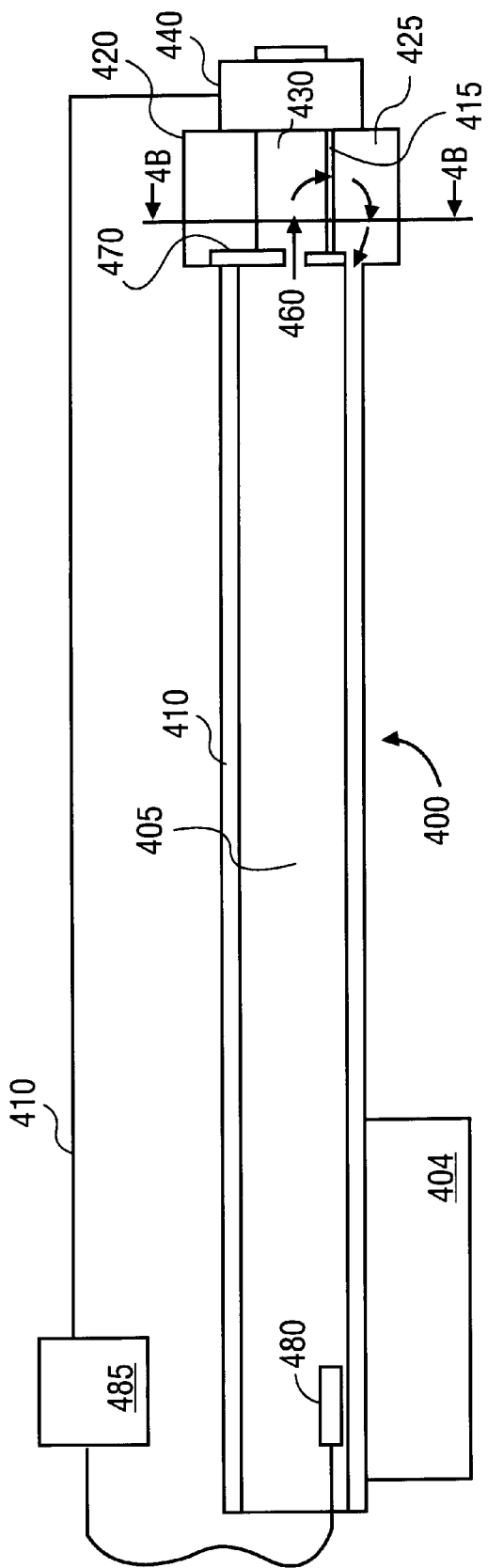
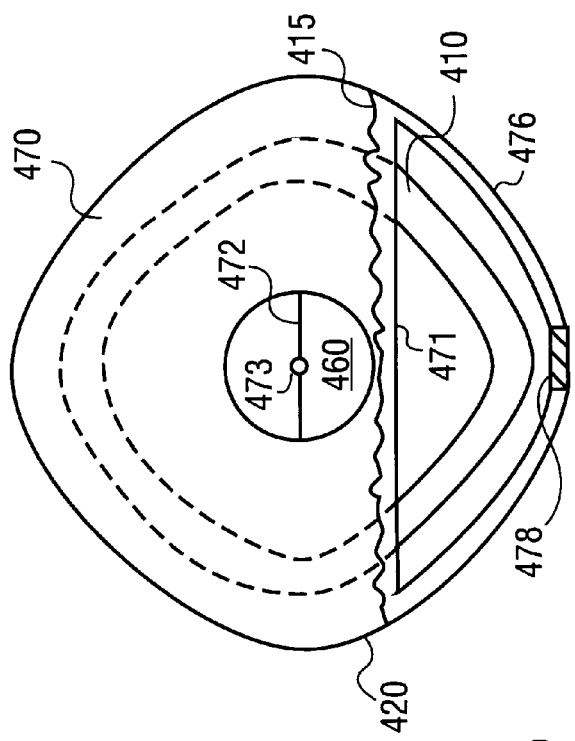
FIG. 4A
FIG. 4B

HEAT PIPE WITH PUMPING CAPABILITIES AND USE THEREOF IN COOLING A DEVICE

BACKGROUND OF THE INVENTION

1. Field of the Invention

The present invention pertains to the field of heat dissipation. More particularly, the present invention pertains to heat pipes that have pumping capabilities and the use thereof in cooling computers or other devices.

2. Description of Related Art

Attaching a heat pipe to an electronic component such as an integrated circuit is a known and successful technique of moving heat away from that electronic component. Unfortunately, continued efficient use of heat pipes in this manner may be jeopardized by the increasing heat generation per unit area of electronic devices. A technique allowing a heat pipe to accommodate larger amounts of heat per unit area may advantageously allow the continuing use of heat pipes to remove heat from electronic components. Additionally, a technique allowing heat pipes to more easily overcome gravitational forces may allow longer heat pipes and/or new applications involving vertical displacement from one end of a heat pipe to the other.

In the conventional heat pipe, one end of the heat pipe is exposed to the heat source and the other end of the heat pipe is exposed to the heat sink, which is at a lower temperature than the heat source. Heat is absorbed from the heat source by evaporation of a liquid-phase working fluid to vapor phase inside the heat pipe at the end exposed to the heat source (the evaporator). The working fluid in vapor phase with its absorbed heat load is thermodynamically driven to the other end of the heat pipe due to a pressure difference created between the heat source and the heat sink.

The heat load is rejected by the working fluid to the heat sink, with consequent condensation of the working fluid to liquid phase at the heat sink end of the heat pipe (the condenser). Then, without leaving the same heat pipe chamber, the condensed working fluid is returned in liquid phase to the heat source end of the heat pipe by a capillary structure located inside the heat pipe.

The capillary structure is typically an elongated wick structure extending for substantially the full interior length of the heat pipe. Capillary flow is the flow of the fluid on or through the wick structure. The capillary pumping capability of a heat pipe is determined in part by the extent to which capillary forces acting on the liquid-phase working fluid in the pores of the wick structure inside the heat pipe dominate over the gravitational force acting on the liquid-phase working fluid.

As electronic devices and especially integrated circuits continue to consume significantly more power while maintaining approximately the same size, the heat generated per unit area (the heat flux) rises. The increasing heat flux may be problematic in causing a "dry out" phenomenon in the heat pipe. The "dry out" phenomenon is produced when the same amount of liquid corresponding to the evaporated amount of liquid in the evaporator is not supplied to the evaporator by the capillary action. If insufficient liquid is supplied, the heat transport efficiency may be adversely affected since there is insufficient working fluid to transport heat from the evaporator.

Some prior art approaches to improving the heat carrying capacity of heat pipes include the use of pumps to replace or supplement capillary forces as the mechanism to return the working liquid to the evaporator. For example, the approaches described in U.S. Pat. Nos. 4,898,231 and 4,470,450 utilize a separate liquid phase chamber and a liquid phase pump to return liquid to the evaporator. While such systems may be appropriate in extra-terrestrial application requiring large amounts of heat to be transported over long distances, these approaches may not be appropriate for relatively compact devices such as portable computer systems.

Thus, the prior art may not provide an adequate pump-assisted heat pipe that may be used in portable computers or other devices. Additionally, the prior art may not provide a solution which enhances capillary flow within a single, shared vapor and fluid flow chamber of a heat pipe.

SUMMARY

A heat pipe with pumping capabilities and use thereof in cooling a device is disclosed. One embodiment of the heat pipe has an internal pumping mechanism that provides an enhanced capillary flow within a chamber of the heat pipe.

BRIEF DESCRIPTION OF THE FIGURES

The present invention is illustrated by way of example and not limitation in the figures of the accompanying drawings.

FIG. 4A illustrates a cross sectional side view of another embodiment of a pump-assisted heat pipe utilizing a sensor, a reservoir portion, and a rotatable barrier member.

FIG. 4B illustrates a cross sectional view of one embodiment of the heat pipe in FIG. 4A taken along section lines 4B—4B.

DETAILED DESCRIPTION

The following description provides a heat pipe with pumping capabilities and use thereof in cooling a device. In the following description, numerous specific details such as electronic devices, electronic components, barrier configurations, orientations of pump mechanisms and heat pipes, wick structure configurations, and working fluid flow directions are set forth in order to provide a more thorough understanding of the present invention. It will be appreciated, however, by one skilled in the art that the invention may be practiced without such specific details.

A pump-assisted heat pipe may advantageously prevent a heat pipe from experiencing the dry out phenomenon that occurs when insufficient liquid-phase working fluid is drawn to the evaporator portion of the heat pipe. Accordingly, such a pump-assisted heat pipe may be used in applications where higher heat flux densities are present than could otherwise be tolerated by the heat pipe. Moreover, such a heat pipe or portions thereof may be oriented vertically, with the evaporator end at a higher elevation relative to the condenser end, and still provide sufficient liquid-phase working fluid at the evaporator. Some embodiments may remain sufficiently small for use in electronic devices by using a small pump that enhances capillary flow within a shared vapor and liquid flow chamber of the heat pipe.

Figure 1:
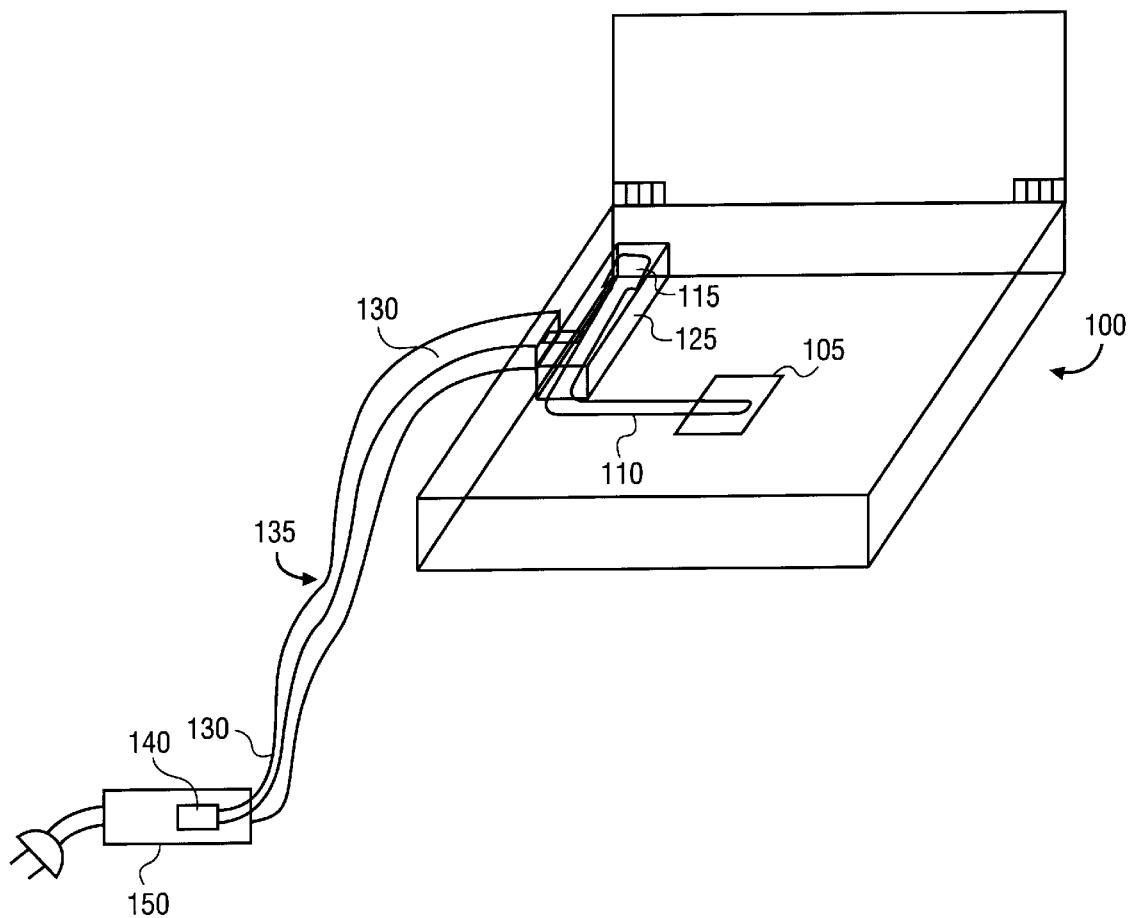
FIG. 1 is a perspective view of one embodiment of a portable computing device utilizing a pump-assisted heat pipe as well as a power chord having a pump-assisted heat pipe.

FIG. 1 illustrates a portable computing device 100 showing two exemplary uses of pump-assisted heat pipes. One heat pipe 110 has a first portion thermally coupled to a heat generating electronic component 105 and a second portion attached to a heat exchanger 125. In this case, a first end of the heat pipe 110 is attached to the electronic component 105 via a thermal and/or mechanical bond using known or otherwise available techniques. The heat exchanger 125 may be a duct with a fan, a heat sink, or any other known or available heat dissipation mechanism. The heat pipe 110 may be cylindrical, rectangular, or otherwise shaped.

The heat pipe 110 includes a pumping mechanism 115 located at a second end opposite the heat generating electronic component 105. The pump mechanism typically includes an external motor and a pumping mechanism internal to the heat pipe 110. The pumping mechanism enhances capillary flow from the condenser end (the portion attached to the heat exchanger 125) toward the evaporator end (the portion attached to the electronic component 105). Since some of the working fluid within the heat pipe 110 may evaporate prior to reaching the opposite end of the heat pipe 110, the pumping mechanism 115 may merely enhance capillary flow toward the evaporator portion. Some or all of capillary flow may not reach the evaporator and/or the opposite end of the heat pipe 110.

A second example of the use of a pump-assisted heat pipe is in a power chord 135 for the portable computing device 100. In the illustrated embodiment, the power chord 135 includes a flexible heat pipe 130 extending to a power supply brick 150. Typically, the power chord 135 includes several electrical conductors (not shown) that are coupled to a power converter (not shown) in the power supply brick 150. The power supply brick 150 includes a pump 140 that enhances capillary flow through the heat pipe 130 so that gravitational forces are overcome and sufficient liquid-phase working fluid is returned to the interface of the heat pipe 130 and warm surfaces in the portable computing device 100. This pump assistance may be particularly useful in the power chord based heat pipe since the power chord 135 may often extend vertically downward when the power supply brick 150 is placed on the floor or another surface lower than the portable computing device 100.

Figures 2A, 2B:
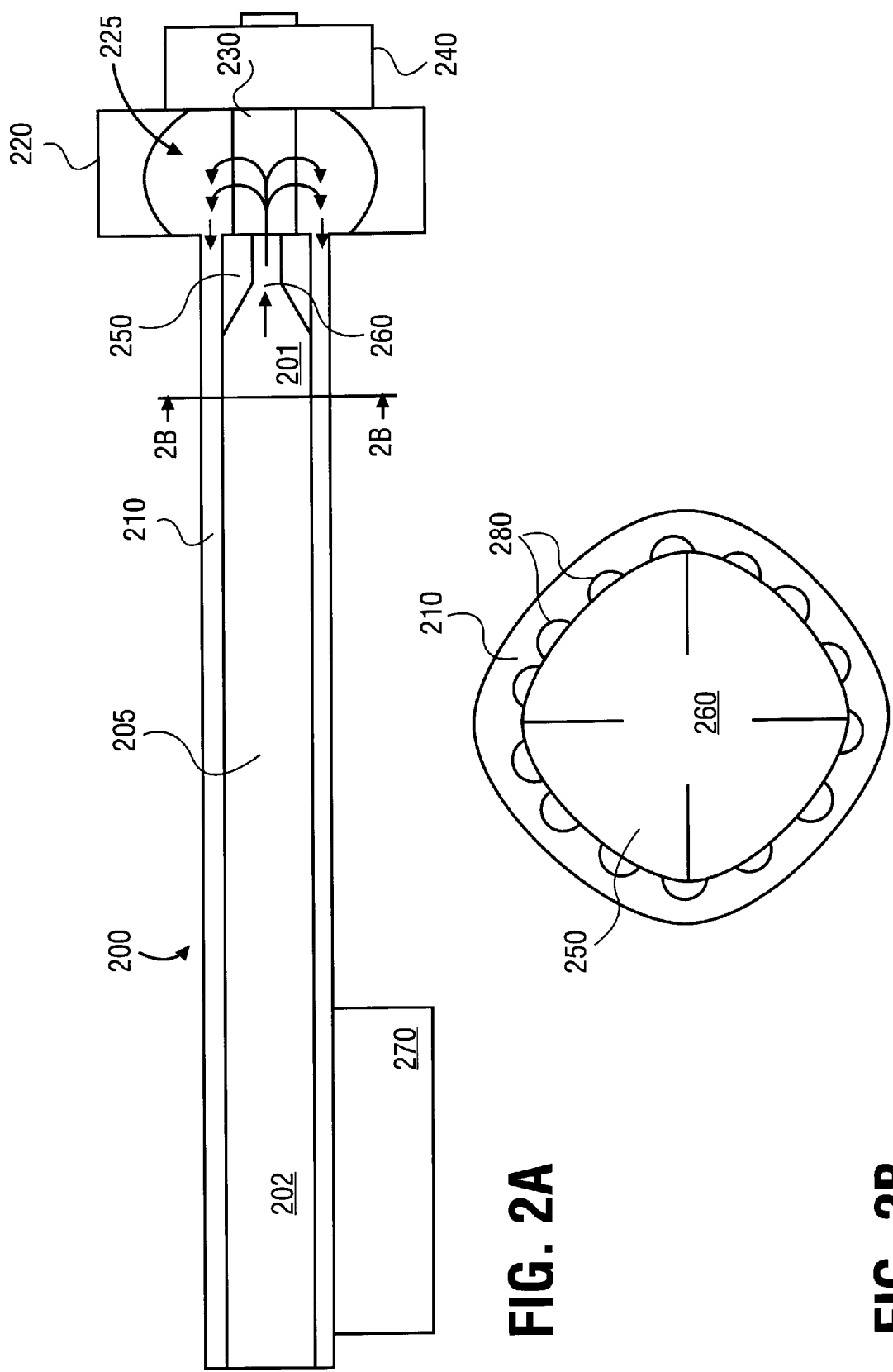
FIG. 2A illustrates a cross sectional side view of one embodiment a heat pipe utilizing a pump mechanism at the condenser end.
FIG. 2B illustrates a cross sectional view of one embodiment of the heat pipe in FIG. 2A along section lines 2B—2B.

FIG. 2A illustrates a more detailed view of one embodiment of a heat pipe 200 with pumping capabilities. The heat pipe 200 has a vapor flow region 205 and a wick structure 210. The wick structure 210 forms a liquid flow region since capillary forces in the wick allow liquid-phase working fluid to pass from a condenser side 201 of the heat pipe 200 to an evaporator side 202. Many types of wick structures are known in the art. For example, the wick structure may comprise a mesh structure, longitudinally oriented grooves on the inner surface of the heat pipe, or a roughened inner surface of the heat pipe. Any appropriate known or available form of wick structure may be used with the presently disclosed heat pipes.

In the illustrated embodiment, the evaporator portion of the heat pipe 200 is located adjacent to a heat generating electronic component 270. Notably, in some embodiments, the heat pipe 200 may be attached to a number heat generating components, to a circuit board, to a regional heat sink, or to any other surface to be cooled. As heat vaporizes liquid at the evaporator end, the vapor flows to the cooler opposite end (the condenser portion) where it condenses.

In order to enhance the capillary flow of returning condensate, a pumping mechanism 230 is provided within an end portion 220 of the heat pipe. A motor 240 is typically provided external to the heat pipe 200 with a drive shaft or other drive mechanism extending into the sealed heat pipe 200. Vapor is pulled in by the pumping mechanism 230 through an inlet 260. The pumping mechanism 230 provides increased pressure in an air outflow chamber 225. As can be appreciated from the view in FIG. 2B, this chamber 225 communicates with capillaries 280 in the wick structure 210 because a barrier member 250 blocks the return of the working fluid to the vapor flow region 205. The barrier member 250 may provide a seal so that the outflow from the pump passes substantially only through the wick structure 210. The barrier member may not be present in some embodiments if, for example, the pumping mechanism 230 sufficiently isolates outflow to the wick structure 210.

Thus, an increased pressure is imparted to the capillaries 280 in the wick portion 210. The capillary flow extends from the pumping mechanism 230 at the condenser side 201 continuously through the wick structure 210 toward the evaporator side 202 until it is again vaporized. The increased pressure head produced by the pump increases the flow toward the evaporator and thereby reduces the risk of dry out and improves the heat transport capability of the heat pipe 200.

Figure 3:
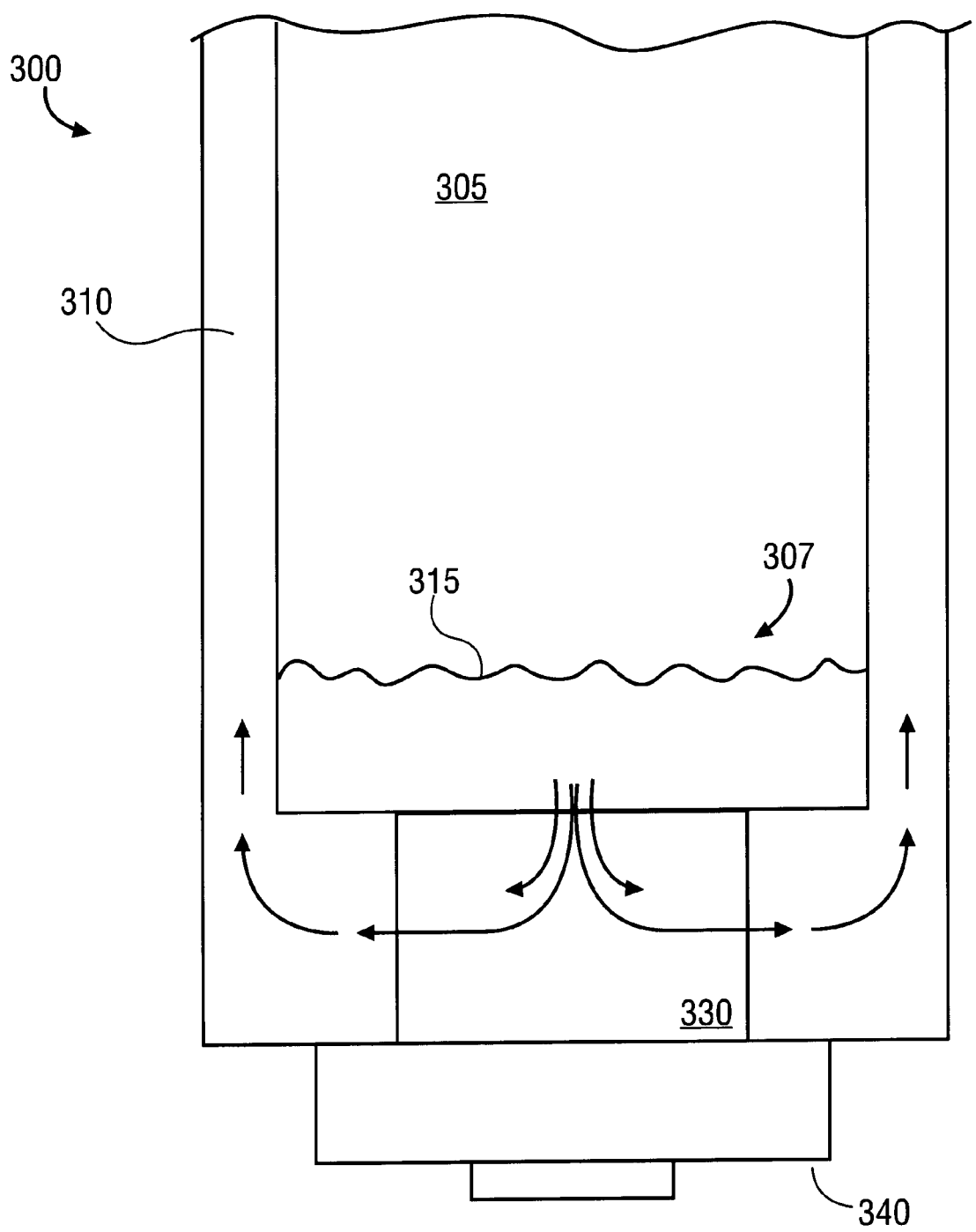
FIG. 3 illustrates a cross sectional side view of one embodiment of a vertically oriented pump-assisted heat pipe.

FIG. 3 illustrates a condenser end of a vertically oriented heat pipe 300. This heat pipe 300 has a reservoir portion 307 formed at a lower end of a vapor flow region 305 of the heat pipe 300. Again, a pumping mechanism 330 driven by a motor 340 draws working fluid in from the center portion of the heat pipe 300 and pumps fluid through the capillaries in a wick portion 310. Thus, the pumping mechanism 330 enhances capillary flow from the condenser portion back towards the evaporator. Excess working fluid 315 may optionally be provided to keep the pumping mechanism 330 primed with working fluid.

This arrangement may be advantageously employed in situations where the capillary forces in the heat pipe are opposed by gravitational forces. For example this vertically oriented heat pipe 300 may be used in the power chord 135 illustrated in FIG. 1, with the pump 340 and the pumping mechanism 330 being located in the power supply brick 150. Since alternating current power is typically available when the power supply brick 150 is used, the power drawn by the motor 340 should not adversely impact the system. Moreover, with the enhanced cooling capability, the system may be able to operate in a higher performance and higher power mode.

FIGS. 4A and 4B illustrate an embodiment of a horizontally oriented heat pipe 400. In this embodiment, the working fluid is again vaporized by heat from an electronic component 404 and flows as vapor in a vapor flow region 405 until it condenses and returns in a wick portion 410. A motor 440 drives a pumping mechanism 430 that enhances capillary flow in the wick portion 410.

A rotatable barrier member 470 ensures that outflow from the pumping mechanism 430 passes downwardly through a reservoir 425 having a working fluid therein. The rotatable barrier member 470 blocks the increased pressure in an end chamber 420 from the pumping mechanism 430 from being applied to the capillaries above a liquid line 415 in the reservoir 425. The liquid line 415 may also be higher to keep the pumping mechanism submersed.

As can be seen from FIG. 4B, the barrier member 470 may be supported by support spokes 472 that attach the barrier member 470 to a central bearing 473. Thus, an inlet 460 for the pumping mechanism 430 allows inflow from the vapor flow region 405. The barrier member 470 has a flat edge 471 and an outer rim 476 such that a bottom aperture is formed. The rim 476 may have a weighted portion 478 at the bottom of the rim 476 to keep the bottom aperture below the liquid line 415 regardless of rotation or orientation of the heat pipe 400. This arrangement increases fluid pressure in the capillaries and forces fluid from the reservoir 425 into the capillaries.

Also shown in FIG. 4A is a sensor 480. The sensor 480 may sense the amount of working fluid at the evaporator of the heat pipe 400. When the working fluid level is low, a control module 485 monitoring signals from the sensor 480 over a signal line 482 may adjust the operation of the motor 440 by sending a signal on a signal line 487. For example, the control module 485 may turn on or speed up the motor if there is too little working fluid at the evaporator. The control module 485 may be a circuit programmed to perform these operations or may simply be a software or mixed software/hardware control module which operates to test the sensor 480 and control the motor 440. Additionally, an alternative sensor (e.g., an ultrasound sensor) may be placed external to the heat pipe 400.

Figure 5:
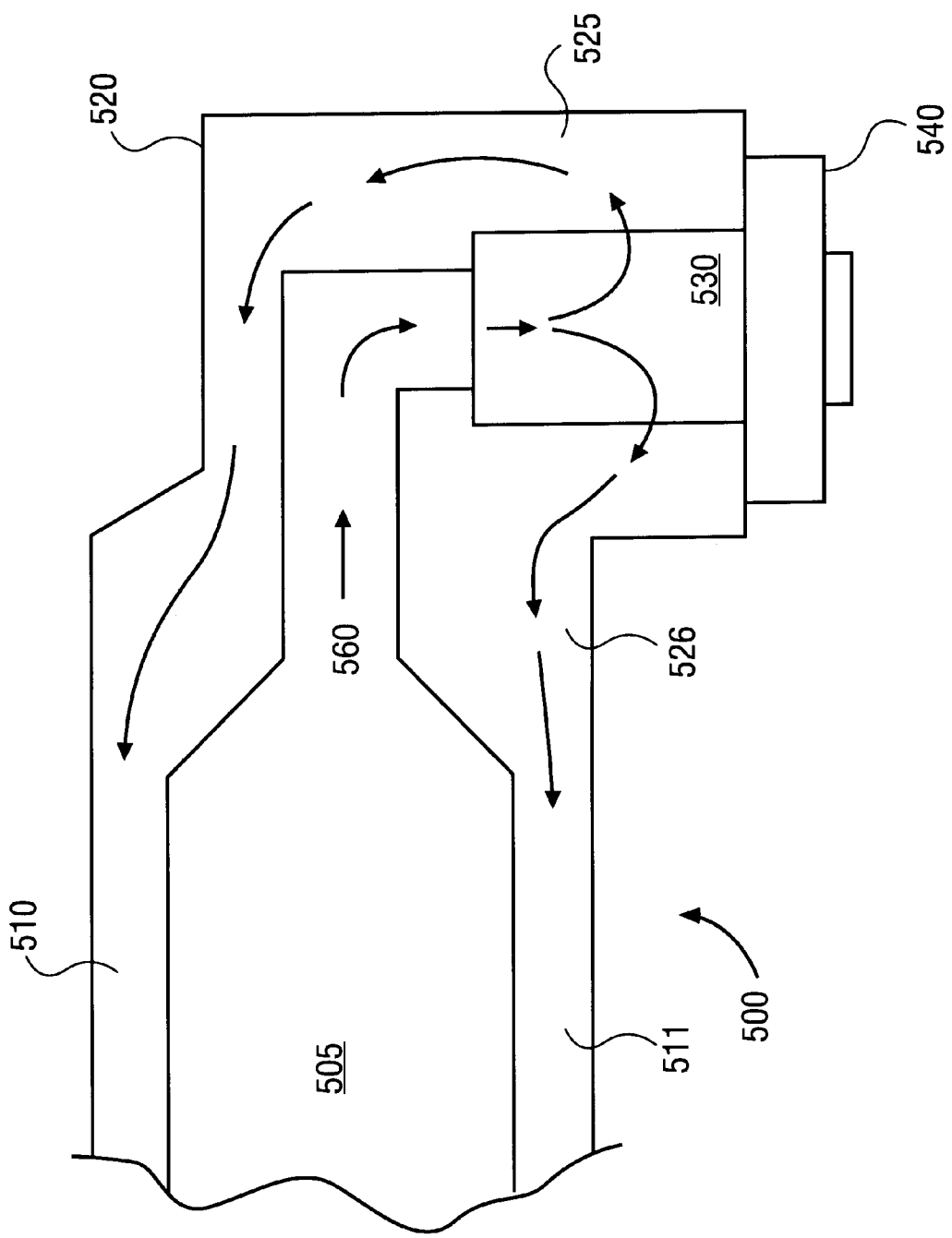
FIG. 5 illustrates another embodiment of a pump-assisted heat pipe utilizing a reservoir portion.

FIG. 5 illustrates another embodiment of a pump-assisted heat pipe 500 utilizing a reservoir. In this embodiment, a pumping mechanism 530 is mounted vertically in a condenser end portion 520 of the heat pipe 500. The working fluid enters from a vapor flow region 505 via an inlet 560 and is pumped by the pumping mechanism 530, which is powered by a motor 540, through outflow chambers 525 and 526 respectively to upper and lower wick portions 510 and 511. Either or both of the outflow chambers 525 and 526 may be partially or fully filled with condensed worling fluid to further enhance the capillary pressure or the amount of working fluid flowing back to the evaporator.

Figure 6:
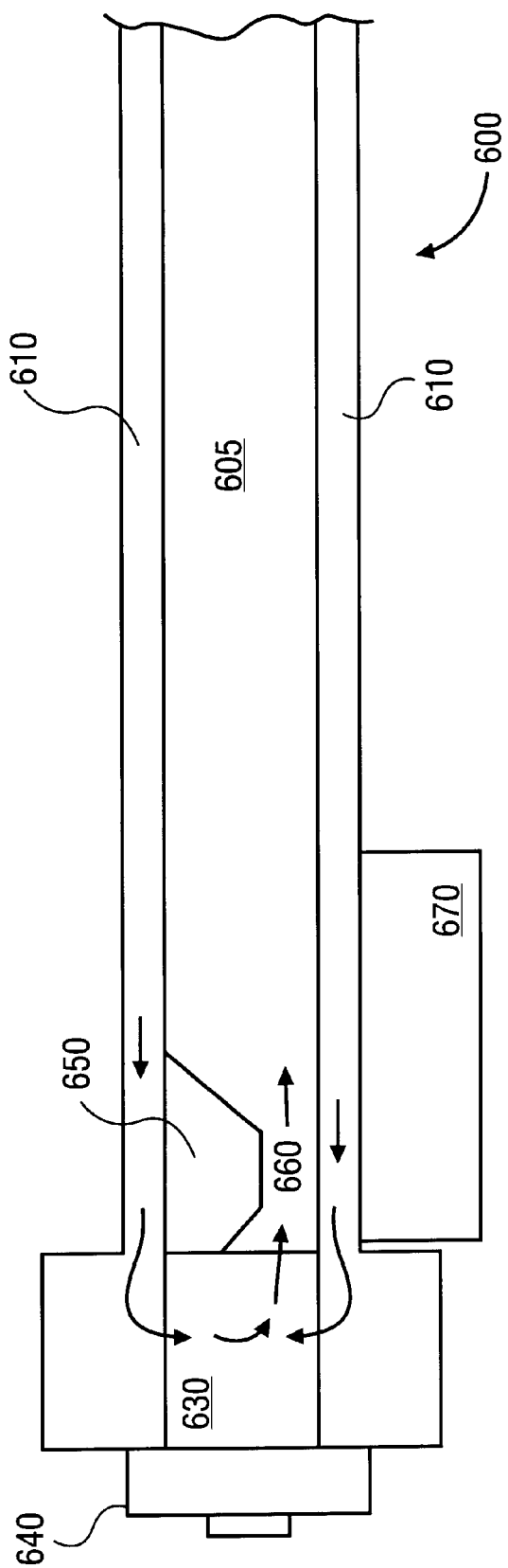
FIG. 6 illustrates an embodiment of a pump-assisted heat pipe having a pumping mechanism at the evaporator end.

FIG. 6 illustrates one embodiment of a heat pipe 600 with pumping capabilities. In this embodiment, a pumping mechanism 630 and a motor 640 are shown at the evaporator end of the heat pipe 600. As previously, the working fluid is evaporated at an evaporator end adjacent to a heat generating component 670, flows through a vapor flow region 605, condenses at a condenser (not shown), and returns via a wick 610. Notably, the previously illustrated or discussed pumping system embodiments may also be arranged in this manner, having the pump at the evaporator end as well. In the embodiment of FIG. 6, a modified barrier member 650 is used, and a portion of the wick 610 adjacent to the heat generating component 670 remains unobstructed to allow evaporation. In the illustrated embodiment, the barrier member 650 extends downwardly from the top of the heat pipe 600, leaving an outlet 660; however, in alternative embodiments, the barrier member 650 may be excluded.

The pumping mechanism 630 has an edge which abuts the end of the wick 610 on the heat pipe edge that is thermally coupled the heat generating component 670. Thus, a seal may be formed, and the pumping mechanism 630 may draw fluid through the capillaries of the wick 610 and avoid the intake of vapor from the vapor flow region 605. The portion of the wick 610 immediately above the component 670 remains unobstructed, so that evaporation may take place, thereby cooling the component 670. Additionally, since the pumping mechanism 630 is just beyond the component 670, pulling working fluid through the capillaries toward the pumping mechanism 630 may help avoid dry out of the heat pipe at the component 670.

Thus, a heat pipe with pumping capabilities and use thereof in cooling a device is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A heat pipe having an internal pumping mechanism that provides an enhanced capillary flow within a chamber of said heat pipe, said internal pumping mechanism being a motor-driven pumping mechanism, wherein a barrier member blocks the return of working fluid to a vapor flow region.

2. The heat pipe of claim 1 wherein the barrier member is a rotatable barrier member.

3. An apparatus comprising:
   a heat pipe having an evaporator portion, a condenser portion, and a wick portion, wherein said heat pipe includes a barrier portion blocks the return of working fluid to a vapor flow region;
   a working fluid within said heat pipe;
   a pumping mechanism, the pumping mechanism being positioned to enhance capillary flow of the working fluid through the wick portion from the condenser portion toward the evaporator portion, the pumping mechanism being a motor-driven pumping mechanism.

4. The apparatus of claim 3 further comprising:
   an electrical motor outside of said heat pipe drivingly coupled to said pumping mechanism.

5. The apparatus of claim 3 wherein the barrier portion is a rotatable barrier portion.

6. The apparatus of claim 3 wherein said heat pipe forms a shared chamber for both capillary flow of a liquid phase of said working fluid and a vapor phase of said working fluid.

7. The apparatus of claim 3 wherein said pumping mechanism has an inlet drawing working fluid from a vapor flow portion of the heat pipe and an outlet operatively engaging the wick portion.

8. The apparatus of claim 7 further comprising an outflow chamber located at the outlet of the pumping mechanism, the outflow chamber being sealed to provide working fluid outflow substantially only through the wick portion.

9. The apparatus of claim 3 wherein said pumping mechanism is positioned adjacent to said condenser portion.

10. The apparatus of claim 9 wherein said apparatus further comprises a reservoir portion adjacent to said pumping mechanism, the pumping mechanism having an outflow directed through the reservoir portion to the wick portion.

11. The apparatus of claim 10 further comprising a rotatable barrier member that rotates based on an orientation of said apparatus, the rotatable barrier member having open bottom portion which directs outflow of said pumping mechanism through said reservoir portion to said wick portion.

12. The apparatus of claim 3 wherein said pumping mechanism is positioned adjacent to said evaporator portion.

13. The apparatus of claim 12 wherein said pumping mechanism has an inlet drawing working fluid from the wick portion.

14. The apparatus of claim 3 further comprising:
a sensor positioned to sense a dry out condition in the evaporator portion; and
a control circuit coupled to control the pumping mechanism as a function of signals received from the sensor.

15. An electronic device comprising:
a housing having an electronic component therein;
a heat dissipation mechanism; and
a heat pipe thermally coupling said electronic component and said heat dissipation mechanism and having an internal pumping mechanism that provides an enhanced capillary flow within a chamber of said heat pipe, the internal pumping mechanism being a motor-driven pumping mechanism, wherein said heat pipe includes a barrier portion blocks the return of working fluid to a vapor flow region.

16. The electronic device of claim 15 wherein said electronic device is a portable computing device and wherein said electronic component is a microprocessor.

17. The electronic device of claim 16 further comprising:
a sensor positioned to sense a dry out condition in a portion of the heat pipe thermally coupled to the microprocessor, and
a control circuit coupled to control the internal pumping mechanism as a function of signals received from the sensor.

18. A portable computing device comprising:
a base portion having a plurality of heat generating components therein;
a power chord extending from said electronic device, the power chord comprising:
a heat pipe thermally coupled to dissipate heat from the base portion, the heat pipe having an internal pumping mechanism that provides an enhanced capillary flow within a chamber of said heat pipe, wherein said heat pipe includes a barrier portion blocks the return of working fluid to a vapor flow region; and
a heat dissipation mechanism thermally coupled to the heat pipe.

19. The portable computing device of claim 18 wherein the power chord further contains a power conversion brick and said heat dissipation mechanism is provided in said power conversion brick.

20. An apparatus comprising:
a heat pipe means for containing a vapor phase and a fluid phase of a working fluid, wherein said heat pipe includes a barrier portion blocks the return of working fluid to a vapor flow region; and
a pumping means for enhancing capillary flow of said fluid phase in said heat pipe means, said pumping means being motor driven.

* * * * *